(12) United States Patent
Bardouillet

(10) Patent No.: US 7,188,131 B2
(45) Date of Patent: Mar. 6, 2007

(54) RANDOM NUMBER GENERATOR

(75) Inventor: Michel Bardouillet, Rousset (FR)

(73) Assignee: STMicroelectronics S.A., Montrouge (FR)

( * ) Notice: Subject to any disclaimer, the term of this patent is extended or adjusted under 35 U.S.C. 154(b) by 624 days.

(21) Appl. No.: 10/721,655

(22) Filed: Nov. 25, 2003

(65) Prior Publication Data

US 2004/0107230 A1 Jun. 3, 2004

(30) Foreign Application Priority Data

Nov. 27, 2002 (FR) .................................. 02/14906

(51) Int. Cl.
*G06F 1/02* (2006.01)
(52) U.S. Cl. ......................................... 708/251; 708/3
(58) Field of Classification Search ........ 708/250–256, 708/3
See application file for complete search history.

(56) References Cited

U.S. PATENT DOCUMENTS

| | | | |
|---|---|---|---|
| 4,855,690 A | | 8/1989 | Dias .............................. 331/78 |
| 5,706,218 A | * | 1/1998 | Hoffman ..................... 708/251 |
| 6,247,033 B1 | | 6/2001 | Kowalski ..................... 708/255 |
| 6,362,695 B1 | * | 3/2002 | Beiley et al. .................. 331/78 |
| 6,714,955 B2 | * | 3/2004 | Le Quere .................... 708/250 |
| 6,795,837 B1 | * | 9/2004 | Wells ............................ 708/3 |

FOREIGN PATENT DOCUMENTS

EP 0 365 930 A2 5/1990

OTHER PUBLICATIONS

Petrie, C. et al., "Modeling and Simulation of Oscillator-Based Random Number Generators," in *Proceedings of the 1996 IEEE International Symposium on Circuits and Systems (ISCAS)*, Atlanta, GA, May 12-15, 1996, pp. 324-327.
Jun, B. et al., "The Intel® Random Number Generator," Cryptography Research, Inc., pp. 1-8, Apr. 1999.

* cited by examiner

*Primary Examiner*—Tan V. Mai
(74) *Attorney, Agent, or Firm*—Lisa K. Jorgenson; Dennis M. de Guzman; Seed IP Law Group PLLC

(57) ABSTRACT

A generator of random numbers by a flip-flop having a data input receiving a first signal at a first frequency comprised in a predetermined range and the instantaneous value of which is conditioned by a disturbing signal, and having a clock input receiving a second signal at a second predetermined frequency, smaller than the first one, said second signal passing through a delay element giving it a delay greater than or equal to the maximum period of the first signal.

20 Claims, 2 Drawing Sheets

RANDOM NUMBER GENERATOR

BACKGROUND OF THE INVENTION

1. Field of the Invention

The present invention relates to a random number generator formed from oscillators at different frequencies.

2. Description of the Related Art

FIG. 1 very schematically shows in the form of blocks a conventional example of a random number generator.

Such a generator uses a first voltage-controlled oscillator (VCO) 1 in a relatively high frequency range (HF). The control of oscillator 1 originates either from an oscillator of lower frequency (MF) (not shown) or from electronic noise generally coming from the same integrated circuit. The output of oscillator 1 provides a triangular signal of variable frequency intended to form, possibly after shaping by a comparator 2, input signal D of a flip-flop 3, output Q of which provides a digital train forming a random number. The function of comparator 2 simply is to shape as square pulses the signal provided by oscillator 1. For this purpose, one of its inputs, for example, its non-inverting input, receives the output of oscillator 1 while its other output (for example, inverting) receives a reference voltage provided by a resistive dividing bridge R1, R2 to the junction point of which is connected a filtering capacitor C providing the reference voltage for comparator 2.

A second oscillator 4 (OSC), at a relatively low frequency (BF) with respect to the frequency of oscillator 1 provides a clock signal to input CLK of flip-flop 3. Frequency BF of oscillator 4 is predetermined.

At each edge (for example, rising) of the output signal of oscillator 4, flip-flop 3 takes into account the state present on its D input. Since this state is at zero or at one according to the signal provided by oscillator 1, the output of flip-flop 3 takes an output state 0 or 1. Since the output signal of oscillator 1 has a frequency conditioned by noise, the succession of states 1 or 0 at the output of flip-flop 3 forms a sequence of random states.

For the circuit of FIG. 1 to operate in this manner, oscillators 1 and 4 must not be synchronized. Indeed, if they are, a repetitive sequence of bits necessarily appears at the output of flip-flop 3. This is in particular why the voltage-control input of oscillator 1 is driven by a signal of intermediary frequency (that is, ranging between frequency BF and the minimum frequency of oscillator 1) or by noise. This is also why the output of oscillator 1 preferentially generates a triangular signal rather than a sinusoid to guarantee the equiprobable character of the output frequencies of oscillator 1. The frequency of oscillator 1 varies within a predetermined fixed range according to the position of a voltage control on the intermediary frequency ramp.

A disadvantage of the circuit of FIG. 1 is that there however remains a risk of oscillator synchronization. Indeed, a noise at the frequency of oscillator 1 transfers onto the supply and thus pollutes oscillator 4. This noise synchronizes the two signals. Indeed, the triggerings are performed with respect to thresholds. Now, the presence of HF noise superposed to the lower frequency imposes that the threshold triggerings will occur with priority on this noise. This effectively amounts to synchronizing the signals.

An example of a random number generator such as illustrated in FIG. 1 is described in article "The Intel Random number generator" by Benjamin Jun and Paul Kocher, published on Apr. 22, 1999, by Cryptography Research Inc.

BRIEF SUMMARY OF THE INVENTION

An embodiment of the present invention provides a novel random number generator which overcomes the disadvantages of known oscillator generators.

An embodiment of the present invention more specifically aims at solving the problems linked to a possible synchronization of the signals from the high-frequency and low-frequency input oscillators of the flip-flop.

One embodiment of the present invention provides a generator of random numbers by a flip-flop having a data input receiving a first signal at a first frequency comprised in a predetermined range and the instantaneous value of which is conditioned by an interfering signal, and having a clock input receiving a second signal at a second predetermined frequency, smaller than the first one, said second signal crossing a delay element giving it a delay greater than or equal to the maximum period of the first signal.

According to an embodiment of the present invention, said disturbing signal is provided by a third oscillator at an intermediary frequency between said first and second frequencies.

According to an embodiment of the present invention, the generator further comprises a comparator for shaping the signal provided by the first oscillator before arrival on the data input of the flip-flop.

According to an embodiment of the present invention, the first oscillator is a voltage-controlled oscillator having a control input receiving said disturbing signal.

According to an embodiment of the present invention, the second frequency is selected to have a ratio of at least 100 with the minimum frequency of the first signal.

According to an embodiment of the present invention, the frequency of the intermediary signal is selected to have a ratio ranging between 5 and 20 with the minimum frequency of the first signal.

The foregoing features of the present invention will be discussed in detail in the following non-limiting description of specific embodiments in connection with the accompanying drawings.

DETAILED DESCRIPTION

Figure 1:
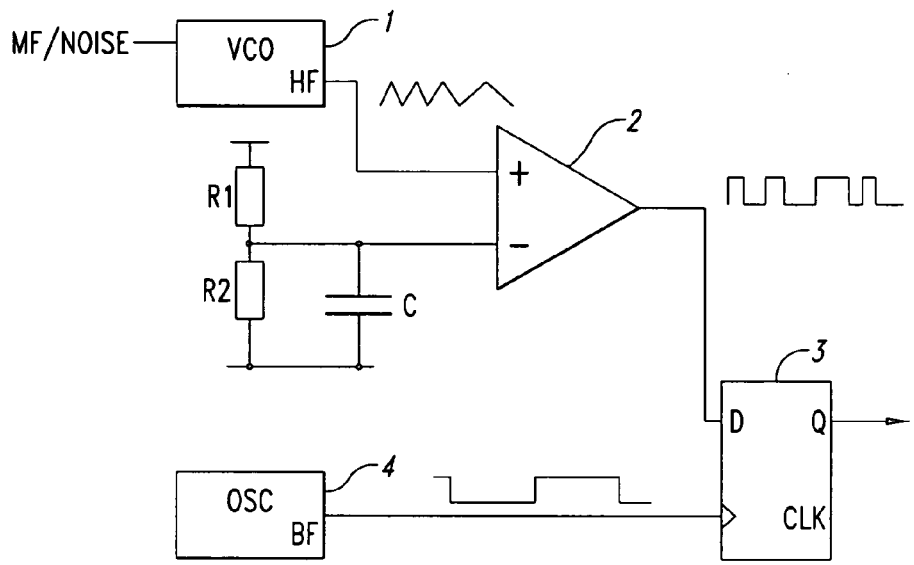
FIG. 1, previously described, schematically shows in the form of blocks a conventional example of a random number generator.

Embodiments of a random number generator are described herein. In the following description, numerous specific details are given to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Same elements have been designated with same reference numerals in the different drawings. For clarity, only those elements that are necessary to the understanding of the present invention have been shown in the drawings and will be described hereafter. In particular, the details constitutive of the voltage-controlled oscillator, of the comparator, and of the flip-flop have not been detailed and are no object of the present invention.

A feature of one embodiment of the present invention is to delay by a predetermined duration the signal provided by an oscillator at a relatively low frequency of control of a flip-flop providing the random number sequence. According to an embodiment of the present invention, this predetermined duration preferably corresponds to the maximum period of a relatively high frequency likely to be provided by a voltage-controlled oscillator, the output of which conditions the flip-flop data input.

Figure 2:
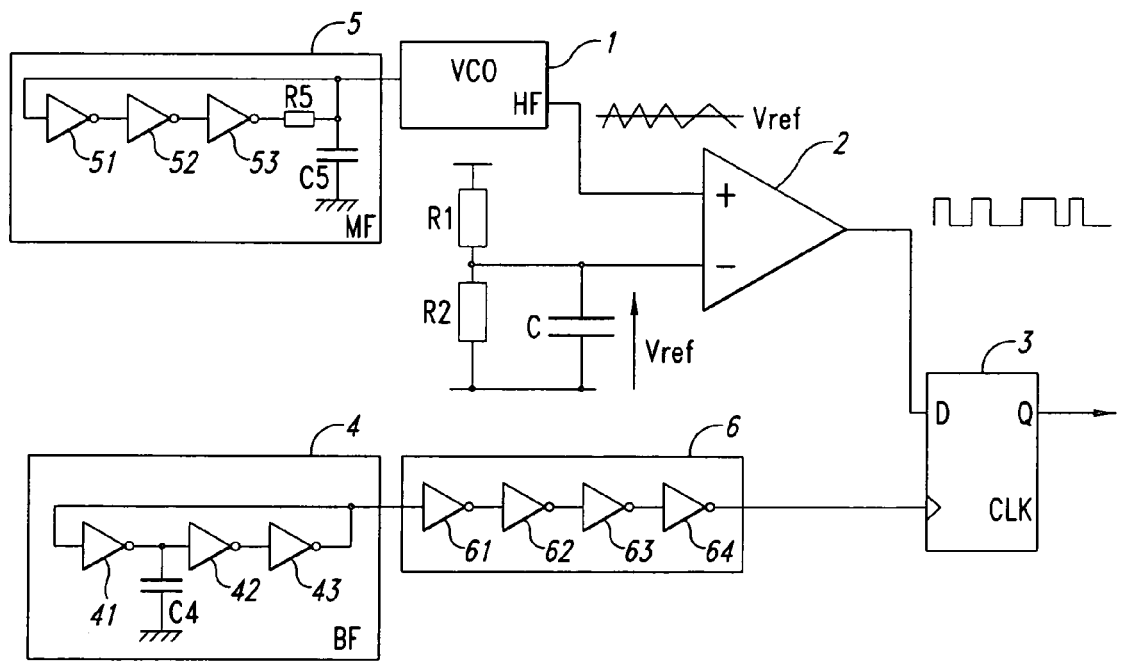
FIG. 2 shows an embodiment of a random number generator according to the present invention.

FIG. 2 schematically shows in the form of blocks an embodiment of a random number generator according to the present invention.

As previously, this generator is based on a flip-flop 3, the D data input of which receives a signal at the frequency of a voltage-controlled oscillator (VCO) 1 having a relatively high predetermined operating frequency range (HF). The clock input of the flip-flop is intended to be controlled at a relatively low frequency (BF) with respect to the frequency of oscillator 1. Oscillator 1 is controlled at an intermediary frequency (MF) or by noise. In the example of FIG. 2, a ring oscillator 5 at an intermediary frequency controlling oscillator 1 has been illustrated.

Optionally and conventionally, the output signal of oscillator 1 can be shaped by a comparator 2 having a first input (for example, non-inverting) receiving the output of oscillator 1 while a second input (for example, inverting) receives a reference voltage Vref provided, for example, by a resistive dividing bridge R1, R2 associated with a charging capacitor C. The function of comparator 2 is, with reference voltage Vref, to set a level for the taking into account of the triangular signal provided by oscillator 1 to restore a square signal.

In the example shown, oscillator 5 is formed of three inverters 51, 52, 53 in series. A capacitor C5 conditioning the oscillating frequency connects the output of inverter 53 to ground, generally with an interposed resistor R5 to obtain a triangular signal. The output of inverter 53 (here, after crossing resistor R5) is looped back on the input of inverter 51 and forms the voltage control signal of oscillator 1. The operation of such a ring oscillator is perfectly conventional and the number of inverters is any number provided that it remains even. Similarly, low-frequency oscillator 4 is formed of inverters 41, 42, and 43 in series and of a capacitor C4 connecting the output of inverter 41 to ground. It thus exhibits the same ring structure as oscillator 5, with the difference that it comprises no resistor. The oscillating frequency is conditioned by the value of capacitor C4.

According to an embodiment of the present invention, clock input CLK of flip-flop 3 does not directly receive this signal provided by low-frequency oscillator 4 but this signal previously crosses a delay element 6. The delay introduced by element 6 is chosen to be at least equal to the maximum period of the signal provided by high-frequency oscillator 1. Ideally, the delay will be equal to this maximum period.

In the example shown, delay element 6 is formed of a series association of several inverters 61, 62, 63, 64, the number of which is chosen according to the significance of the desired delay.

Delay element 6 enables that, even if, incidentally, a period of the signal provided by oscillator 4 appears to be synchronized with the high-frequency signal provided by oscillator 1, the next periods will become desynchronized due to the introduced delay. The equiprobable character of the obtained numbers conditioned only by source 5 of medium frequency or of intermediary frequency thus appears again.

Now, the possible noise introduced by intermediary-frequency oscillator 5 on the power supply necessarily has a frequency smaller than or equal to that of oscillator 1. Indeed, provided that the noise of oscillator 5 has an amplitude smaller than or equal to that of oscillator 1, the latter will mask the possible noise of oscillator 5. Accordingly, this noise at intermediary frequency does not risk causing a synchronization. Accordingly, the oscillator which conditions the output state of flip-flop 3 effectively is the oscillator of intermediary frequency 5.

Figure 3:
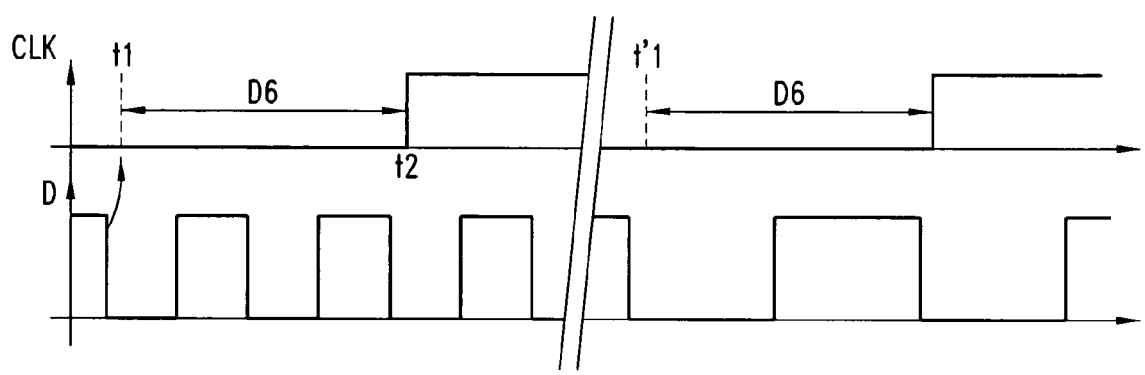
FIG. 3 illustrates, in timing diagrams, the operation of the generator of FIG. 2.

This operation is illustrated in FIG. 3 which shows, in the form of timing diagrams, an example of shape of clock signal CLK of flip-flop 3 and of input signal D of this flip-flop.

In the left-hand portion of FIG. 3, it is assumed that the signal of input D is at the maximum frequency of oscillator 1 (minimum period). In the right-hand portion of this drawing, a minimum frequency originating from oscillator 1 (maximum period) is assumed. In the example, the case where the maximum frequency corresponds to twice the minimum frequency is considered.

Assuming an incidental synchronization of the output signal of flip-flop 4 (edge in dotted lines t1 on signal CLK) with the D input of the flip-flop, fixed delay D6 introduced by element 6 (FIG. 2) makes the rising edge of clock signal CLK occur at a time t2. It can thus be seen that the D input state taken into account occurs after one period of the signal of maximum frequency which follows the synchronization time. Accordingly, the risk linked to the synchronization disappears since it really occurs. In the right-hand portion of FIG. 3, a synchronization is assumed at a time t'1. Here again, the introduced delay D6 makes the rising edge of signal CLK occur at least shifted by one period with respect to that of the minimum frequency.

The introduced delay D6 is greater than or equal to the maximum period of fast oscillator 1. It is preferably equal to this maximum period.

An advantage of one embodiment of the present invention is that it avoids the consequences of a risk of synchronization of the high frequency and low-frequency oscillators of the random number generator due, for example, to a pollution of the intermediary frequency signal by noise of the high-frequency signal.

Another advantage of one embodiment of the present invention is that its implementation is particularly simple. Indeed, the modification to be brought to a conventional random number generator with a flip-flop and oscillators is to add a delay element of a predetermined duration in series with the slow oscillator.

Preferably in one example embodiment, the high frequency is at least 100 times greater than the low frequency, and the intermediary frequency is between 5 and 20 times greater than the low frequency. As a specific example of implementation, the respective oscillator frequencies may be of 1 kHz for the low frequency (BF), 10 kHz for the intermediary frequency (MF), and a frequency ranging between 100 kHz and 200 kHz for the high frequency (HF).

Of course, the present invention is likely to have various alterations, modifications, and improvements which will readily occur to those skilled in the art. In particular, the practical implementation of the delay element and of the oscillators is within the abilities of those skilled in the art based on the functional indications given hereabove and on the application. It should be noted that other oscillator forms than ring oscillators with inverters may be used. Further, it should be noted that the accuracy of the delay introduced by element 6 is not critical. For the equiprobability result to be obtained, over the entire variation range of oscillator 1, there is one half of states 1, and one half of states 0.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

What is claimed is:

1. A generator of random numbers by a flip-flop, having a data input to receive a first signal at a first frequency comprised in a predetermined range and an instantaneous value of which is conditioned by a disturbing signal, and having a clock input to receive a second signal at a second predetermined frequency, smaller than the first one, said second signal passing through a delay element giving the second signal a delay greater than or equal to a maximum period of the first signal.

2. The generator of claim 1 wherein said disturbing signal is provided by a third oscillator at an intermediary frequency between said first and second frequencies.

3. The generator of claim 2 wherein the intermediary frequency is selected to have a ratio ranging between 5 and 20 with respect to a minimum frequency of the first signal.

4. The generator of claim 1, further comprising a comparator to set up the first signal provided by a first oscillator before arrival on the data input of the flip-flop.

5. The generator of claim 1 wherein the first signal is provided by a first oscillator comprising a voltage-controlled oscillator having a control input to receive said disturbing signal.

6. The generator of claim 1 wherein the second frequency is selected to have a ratio of at least 100 with respect to a minimum frequency of the first signal.

7. An apparatus to generate random numbers, the apparatus comprising:
    a circuit element having a first input terminal to receive a first signal having a first frequency and a second input terminal to receive a second signal having a second frequency smaller than the first frequency;
    a first signal generator coupled to the first input terminal of the circuit element to provide the first signal;
    a second signal generator coupled to the second input terminal of the circuit element to provide the second signal;
    a third signal generator coupled to the first signal generator to provide a third signal to control the first signal generator; and
    a delay element coupled to the second signal generator to provide a delay to the second signal that is at least equal to a maximum period of the first signal.

8. The apparatus of claim 7 wherein the third signal has a third frequency that is between the first and second frequencies.

9. The apparatus of claim 7 wherein the circuit element comprises a flip-flop, and wherein the first input terminal comprises a data terminal and the second input terminal comprises a clock terminal.

10. The apparatus of claim 7 wherein the third signal generator includes:
    a series connection of inverters;
    a capacitor coupled between an output terminal of a last inverter in the series and ground; and
    a feedback loop between the output terminal of the last inverter and an input terminal of a first inverter in the series.

11. The apparatus of claim 7 wherein the delay element includes a plurality of inverters connected in series.

12. The apparatus of claim 7 wherein the second signal generator includes:
    a series connection of inverters;
    a capacitor coupled between an output terminal of a first inverter in the series and ground; and
    a feedback loop between an output terminal of a last inverter in the series and an input terminal of the first inverter.

13. The apparatus of claim 7, further comprising:
    a comparator to shape the first signal, the comparator having an output terminal coupled to the first input terminal of the circuit element and having a non-inverting input terminal coupled to the first signal generator to receive the first signal; and
    a resistive divider circuit having a node coupled to a capacitor and to an inverting input terminal of the comparator.

14. The apparatus of claim 7 wherein the first signal generator comprises a voltage-controlled oscillator.

15. A method to generate random numbers, the method comprising:
    providing a first signal at a first frequency in a predetermined range as a data input of a flip-flop;
    controlling an instantaneous frequency of the first signal;
    providing a second signal at a second frequency smaller than the first frequency; and
    delaying the second signal with a delay at least equal to a maximum period of the first signal and providing the delayed second signal as a clock input of the flip-flop.

16. The method of claim 15 wherein controlling the instantaneous frequency of the first signal includes providing a third signal having a third frequency that is between the first and second frequencies and using the third signal to control the instantaneous frequency of the first signal.

17. The method of claim 15, further comprising shaping the first signal prior to providing the first signal as the data input.

18. The method of claim 15, further comprising using noise associated with the first signal to mask noise associated with a third signal that controls the instantaneous frequency of the first signal.

19. A system for generating random numbers, the system comprising:
  a means for providing a first signal at a first frequency in a predetermined range as a data input of a flip-flop;
  a means for controlling an instantaneous frequency of the first signal;
  a means for providing a second signal at a second frequency smaller than the first frequency; and
  a means for delaying the second signal with a delay at least equal to a maximum period of the first signal and providing the delayed second signal as a clock input of the flip-flop.

20. The system of claim 19, further comprising a means for shaping the first signal.

* * * * *